United States Patent [19]

Yarwood et al.

[11] 4,373,571
[45] Feb. 15, 1983

[54] APPARATUS AND PROCESS FOR ELECTROMAGNETICALLY SHAPING A MOLTEN MATERIAL WITHIN A NARROW CONTAINMENT ZONE

[75] Inventors: John C. Yarwood, Madison, Conn.; Gerhart K. Gaule, Elberon, N.J.; Gary L. Ungarean, Woodbridge, Conn.

[73] Assignee: Olin Corporation, New Haven, Conn.

[21] Appl. No.: 257,442

[22] Filed: Apr. 24, 1981

Related U.S. Application Data

[63] Continuation-in-part of Ser. No. 213,127, Dec. 4, 1980.

[51] Int. Cl.³ .......................................... B22D 27/02
[52] U.S. Cl. ................................ 164/467; 164/503; 164/486
[58] Field of Search ............... 164/467, 503, 486, 498

[56] References Cited

U.S. PATENT DOCUMENTS

| 3,096,158 | 7/1963 | Gaule et al. | |
| 3,293,002 | 12/1966 | Spielmann et al. | |
| 3,453,352 | 7/1969 | Goundry | |
| 3,467,166 | 9/1969 | Getselev et al. | 164/467 |
| 3,605,865 | 9/1971 | Getselev et al. | 164/503 |
| 3,985,179 | 10/1976 | Goodrich et al. | 164/503 |
| 4,004,631 | 1/1977 | Goodrich et al. | 164/503 |
| 4,161,206 | 7/1979 | Yarwood et al. | 164/80 |
| 4,161,978 | 7/1979 | Brooks et al. | 164/467 |
| 4,215,738 | 8/1980 | Gaule et al. | 164/467 |

FOREIGN PATENT DOCUMENTS 2944077 12/1979 Fed. Rep. of Germany .
2009002 6/1979 United Kingdom .

OTHER PUBLICATIONS

National Technical Information Service Report PB-248,963, "Scale-Up of Program on Continuous Silicon Solar Cells" by A. D. Morrison, Sep. 1975.
G. K. Gaule et al., "The Role of Surface Tension in Pulling Single Crystals of Controlled Dimensions", Metallurgy of Elemental and Compound Semiconductors, published by Interscience Publishers, Inc., New York, 1961, pp. 201-226.
J. Davies et al., Induction Heating Handbook, published by McGraw-Hill Book Company (UK) Limited, England, 1979, pp. 93-95 and 100.

Primary Examiner—Gus T. Hampilos
Assistant Examiner—K. Y. Lin
Attorney, Agent, or Firm—Howard M. Cohn; Barry L. Kelmachter; Paul Weinstein

[57] ABSTRACT

An apparatus and process is provided for electromagnetically forming a material into a desired thin strip shape. The apparatus and process includes a first portion containing a sump of said material in molten form. A second portion is located downstream of and communicates with the first portion. The second portion defines a containment zone of 5 mm or less for electromagnetically shaping the molten material into the thin strip shape whereby efficiency is improved through reduction of power consumption.

42 Claims, 5 Drawing Figures

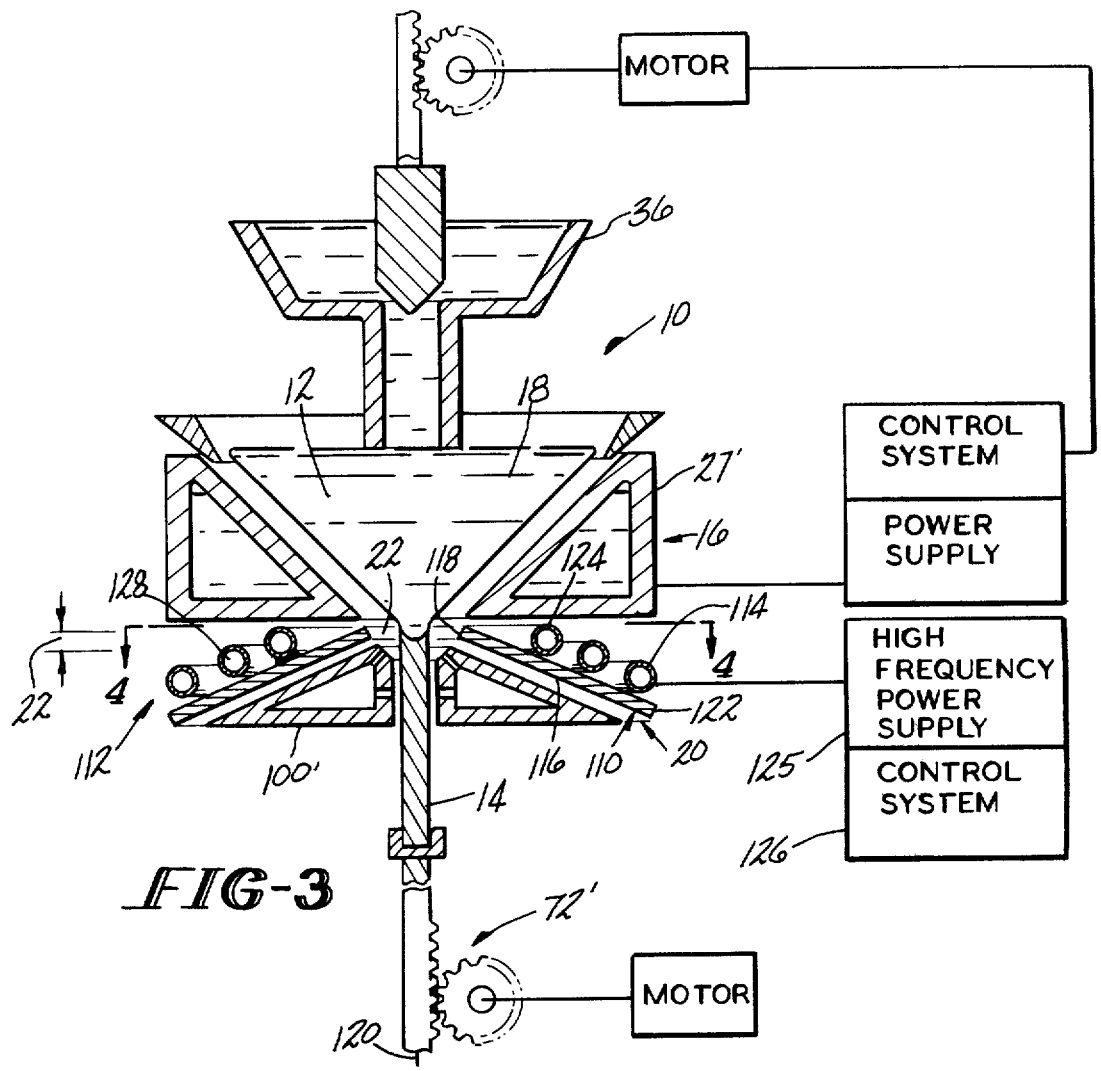
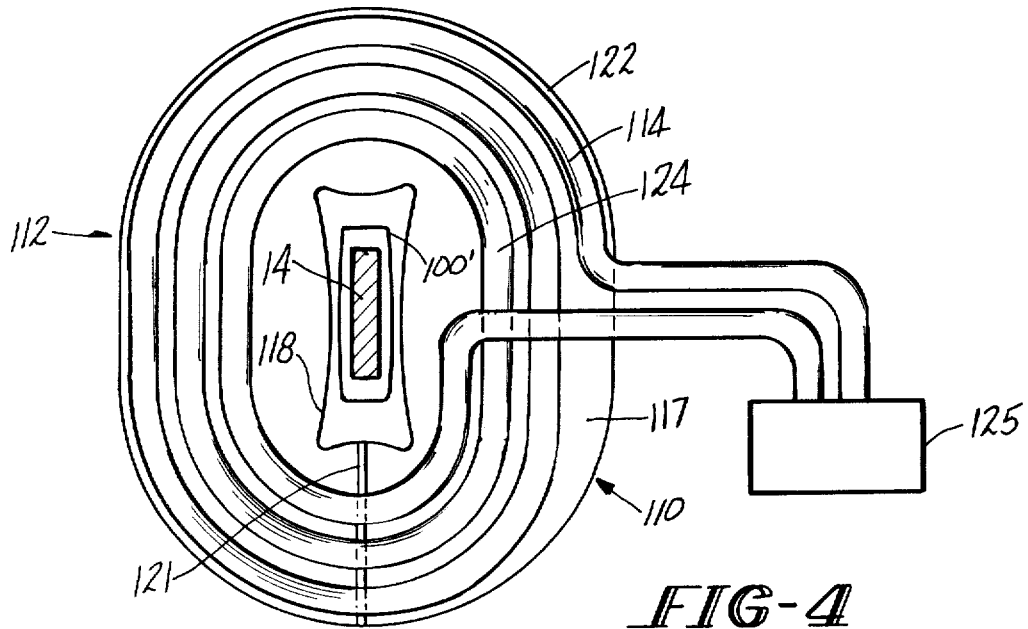

APPARATUS AND PROCESS FOR ELECTROMAGNETICALLY SHAPING A MOLTEN MATERIAL WITHIN A NARROW CONTAINMENT ZONE

This application is a continuation-in-part of U.S. application Ser. No. 213,127 filed Dec. 4, 1980.

While the invention is subject to a wide range of applications, it is especially suited for use in electromagnetic casting of strip material and will be particularly described in that connection. The process and apparatus is preferably used to shape the molten material within a narrow containment zone whereby a reduction of power consumption is achieved.

Up until now, the prior art relating to electromagnetic casting of thin strip semi-conductive materials specified an inductor shaping system over a comparitively long length of the molten material in the narrow cross-sectional region that is being shaped into the relatively thin strip. This prior art is though to have a tendency to aggravate the high frequency power losses by applying the required very high frequency containment current density over the comparatively long length of molten material. In addition, it is believed that in the shaping of the molten material into narrow cross section over a long length, problems arise, such as surface tension and irregular inductance fields, which may create poor, irregular shape control of the resulting thin strip material being formed.

A variety of processes have been developed for forming semi-conductive materials such as silicon into a thin strip shape. Examples of such approaches can be found in National Technical Information Service Report PB-248,963 "Scale-up of Program on Continuous Silicon Solar Cells" by A. D. Morrison, published in September 1975, and a paper entitled "The Role of Surface Tension in Pulling Single Crystals of Controlled Dimensions" by G. K. Gaule et al. from Metallurgy of Elemental and Compound Semiconductors, published by Interscience Publishers, Inc., New York in 1961, pages 201-226.

The Morrison publication is exemplary of the state of the art with respect to the pulling of strip-type materials from a melt of silicon. The Gaule et al. publication is similarly exemplary and of particular interest insofar as it discloses the use of electromagnetic forces for applying external pressure at the growth interface. In addition, Gaule et al. discloses the use of a concentrator carrying a radio-frequency (RF) current surrounding the molten material and causing inward-directed pressure acting on portions of the melt to help control the shape of the surface of the molten material. (See FIG. 5 on page 208.) The design and use of concentrators is described in *Induction Heating Handbook, Davies and Simpson, McGraw-Hill Book Co., UK, Limited, England* 1979, pages 93-95 and 100. The concentrator may also be used in conjunction with guides to provide proper shaping of the melt at the corners of the thin, flat crystal as shown in FIG. 8 of the publication. The concentrators of this reference are used in conjunction with the Czochralski or levitation method for the pulling of single crystals from a melt of semi-conductor material. The present invention differs from Gaule et al. in that the concentrator is used to define a very short electromagnetic containment zone for shaping molten material after it has already been preferably partially shaped by an adjacent low frequency electromagnetic field.

In U.S. patent application, Ser. No. 139,617, filed Apr. 11, 1980, by M. J. Pryor, an electromagnetic thin strip casting apparatus and process is described which is adapted for forming thin strip castings of a variety of materials including semi-conductive materials such as silicon. In this apparatus, a specially-shaped inductor is utilized for containing a funnel-shaped pool of molten material and for forming the material into the desired thin strip shape. The process can be carried out continuously or semi-continuously as desired. The second portion of the electromagnetic containing and forming apparatus as set forth in Pryor's application is an inductor which has a longer containment zone of narrow cross section than the containment zone of the present invention.

In U.S. patent application, Ser. No. 158,040, filed June 9, 1980, by J. Winter, an electromagnetic thin strip reforming apparatus and process is described which is adapted for forming thin strip castings of a variety of materials including semi-conductive materials such as silicon. In this apparatus, an input device conveys the starting strip of material to the electromagnetic apparatus to form the floating molten zone and an output device conveys thin strip of the material away from the electromagnetic device.

In U.S. patent application, Ser. No. 213,125, filed Dec. 4, 1980, by J. Yarwood et al., there is disclosed an apparatus having a first portion for electromagnetically containing and forming molten material into a cross-sectional shape substantially the same as the desired resulting thin strip shape. A second portion receives the molten material in the thin strip shape from the first portion and reduces the bulging in the cross-sectional shape which is due to surface tension. The second portion provides an electromagnetic field having a reduced strength as compared to the strength of the electromagnetic field in the first portion. The present invention overcomes the problem of distortion due to surface tension by forming the molten material to the desired thin strip shape in a very short containment zone as the molten material is solidifying and thus counteracts the surface tension and gravity which can lead to a bulging or otherwise undesirable shape of the resulting thin strip. The prior art statement of this application includes art relating to the recrystallization of semiconductor materials and is incorporated into the present application by reference.

A considerable body of art has developed with respect to the use of electromagnetic containment for the purposes of casting metals. These electromagnetic casting apparatuses comprise a three-part mold consisting of a water cooled inductor, a non-magnetic screen, and a manifold for applying cooling water to the resultant casting. Such an apparatus is exemplified in U.S. Pat. No. 3,467,166 to Getselev et al. Containment of the molten metal is achieved without direct contact between the molten metal and any component of the mold. Solidification of the molten metal is attained by the direct application of water from a cooling manifold to the solidifying shell of the casting. However, it should be noted that the possibility of applying coolant directly to the molten material is neither disclosed nor suggested. An elaborate discussion of the prior art relating to electromagnetic casting is found in U.S. Pat. No. 4,161,206 to Yarwood et al. That prior art statement is intended to be incorporated by reference herein. The Yarwood et al. patent deals with a control system for controlling the electromagnetic process which is believed to have particular use in the apparatus of the present invention.

Non-magnetic screens of the prior art are typically utilized to properly shape the magnetic field for containing the molten metal as exemplified in U.S. Pat. No. 3,605,865 to Getselev. The latter patent teaches the provision of an electromagnetic screen with upwardly-directed thickening so that the rate of attenuation of the magnetic field of the inductor is increased upwardly. The present invention may help eliminate the need for non-magnetic screens because of the shorter distance in which molten material can be solidified.

Another approach with respect to use of non-magnetic screens is exemplified in U.S. Pat. Nos. 3,985,179 and 4,004,631 to Goodrich et al. The '179 reference describes the use of a shaped inductor in conjunction with a screen to modify the electromagnetic forming field so that a gradually diminishing flux density is provided whereby the radial forces on the molten metal surface are gradually reduced toward the upper portion of the molten metal column to maintain the vertical surfaces of the molten metal essentially straight. The '631 patent is directed to an electromagnetic inductor provided with a coolant jacket which directs coolant onto the metal being cast.

A shaped inductor for molding molten material is disclosed in U.K. patent application No. 2,009,002 to Swiss Aluminum, Ltd. This application teaches the concept of reducing the vertical dimension of an inductor of constant thickness in order to raise the current density in the inductor and the magnetic field strength at the location of reduced dimension. The aim of this invention is to produce ingots having a convex shape in the side walls whereby the shrinkage caused by the cooling of the ingots results in flat surfaces.

It is an object of the present invention to provide an apparatus and process for forming a material into a thin strip shape which substantially obviates one or more of the limitations and disadvantages of the described prior arrangement.

It is a further object of the present invention to provide an apparatus and process for electromagnetically forming a material into a desired thin strip wherein a short containment zone is used to form the material.

It is a still further object of the present invention to provide an apparatus and process for electromagnetically forming a material into a desired thin strip shape in a manner which produces a reduction in power consumption and is thereby relatively inexpensive to manufacture and operate.

Accordingly, there has been provided an apparatus for electromagnetically forming a material into a desired thin strip shape. The apparatus comprises a first portion for forming a sump of the material in molten form. A second portion is provided downstream of and communicating with the first portion. The second portion defines a containment zone of 5 mm or less for electromagnetically shaping the molten material into the thin strip shape whereby efficiency is improved by reducing the power consumption. The second portion includes a concentrator device for producing an electromagnetic field to establish the containment zone. A second embodiment of the invention uses a concentrator having a narrow inner surface directly adjacent and downstream from the first portion.

For a better understanding of the present invention, together with other and further objects thereof, reference is had to the following description taken in connection with the accompanying drawings while its scope will be pointed out in the appended claims.

FIG. 3 is a schematic representation of a casting apparatus in accordance with a second embodiment of the present invention;

FIG. 4 is a cross-sectional view through 4—4 of FIG. 3; and

Figure 1:
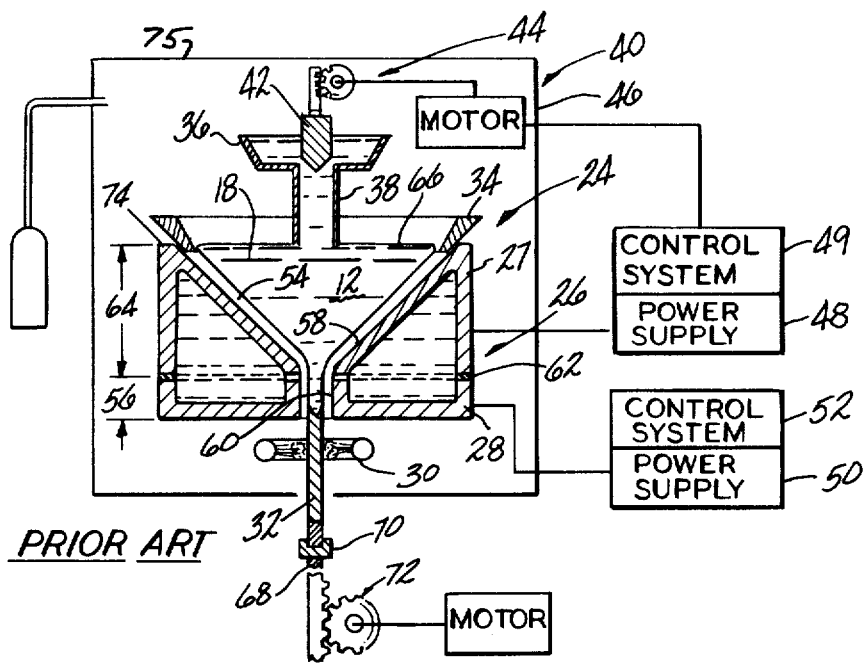
FIG. 1 is a schematic representation of a prior art casting apparatus which is related to the present invention.

An apparatus 10 is provided for electromagnetically forming a material 12 into a desired thin strip shape 14. The apparatus 10 comprises a first portion 16 for forming a sump 18 of the material 12 in molten form. A second portion 20 is provided downstream of and communicating with the first portion 16. The second portion 20 defines a containment zone 22 of 5 mm or less for electromagnetically shaping said molten material into said thin strip shape 14 whereby efficiency is improved by reducing power consumption.

Referring now to FIG. 1, there is shown by way of example an electromagnetic casting apparatus of type known in the prior art and described in U.S. patent application Ser. No. 139,617, filed Apr. 11, 1980, by M. J. Pryor. An electromagnetic casting mold 24 may comprise an electromagnetic containment system 26 being formed of two individual inductors 27 and 28 which are water cooled; a cooling manifold 30 for applying water to the peripheral surface of the material being cast 32 and a non-magnetic screen 34. In accordance with this prior art disclosure, molten material such as a semi-conductor like silicon or germanium or a metal or alloy is continuously introduced into the mold during a casting run in a normal manner using a trough 36, downspout 38, and molten material head control 40. The head control 40 can comprise an ordinary valve member 42 which can be manually operated or preferably automatically controlled in the manner described in U. S. patent application Ser. No. 110,893, filed Jan. 10, 1980, by Ungarean et al. In accordance with the preferred approach, the valve member 42 is arranged for movement axially of the casting and downspout 38 by means of a rack and pinion arrangement 44 actuated by a suitable stepping or serving motor 46 which in turn is actuated from the power supply 48 and control system 49. The flow of molten material through the downspout 38 may be controlled in accordance with long term increases or decreases in the inductance of the inductor 26. Further details of this approach can be found by reference to the Ungarean et al. application.

The inductors 27 and 28 are excited by alternating currents from power sources 48 and 50, respectively, and control systems 49 and 52, respectively. The power sources and control systems may be of any desired design; however, preferably they are in accordance with the teachings of U.S. Pat. No. 4,161,206 to Yarwood et al. In that approach the current in the inductors is controlled in a manner so as to maintain the inductance of the inductor substantially constant. This insures a uniform air gap being maintained between the molten material and the opposing inductor as a casting run proceeds.

The alternating current in the inductors produces a magnetic field which interacts with the molten material 12 to produce eddy currents therein. These eddy currents in turn interact with the magnetic field and produce forces which apply a magnetic pressure to the molten material 12 to contain it so that it solidifies in a desired ingot cross section. An air gap 54 exists during casting between the molten material 12 and the inductors 27 and 28. The molten material is formed or molded in the solidification zone 56 into the same general shape as the inductor 28 thereby providing the desired casting cross section. The inductor 28 preferably has a rectangular shape surrounding the molten metal in order to obtain the desired thin strip cross section.

Regarding the details of inductors 27 and 28, it can be seen that upper inductor 27 has an outwardly flared surface 58 while the lower inductor 28 has a substantially vertical surface 60. An insulating gasket 62 is employed between the upper and lower inductors 27 and 28. The insulating gasket 62 serves to electrically insulate the upper inductor 27 from the lower inductor 28. The two inductors 27 and 28 may be secured together in a water tight manner by means of insulating screws (not shown). The purpose of insulating the upper inductor 27 from the lower inductor 28 is to provide independent powering of the upper inductor relative to the lower inductor in order to tailor the current levels in the respective surfaces 58 and 60 of the inductors. This aids in providing the desired strip forming action in the zone 56 of the inductor 28 and the desired molten material sump supporting action in zone 64 of the inductor 27.

In order to tailor the power applied to each inductor 27 and 28, it is desirable to employ two power supplies 48 and 50 of different frequency and two control systems 49 and 52, respectively. In this manner, the current applied to the upper inductor 27 may be totally different than the current applied to the lower inductor 28 resulting in corresponding differences in the magnetic field strengths of the respective zones 64 and 56. Thus, depending on the material being cast, it should be possible to better balance the desired magnetic force provided by the inductors and the hydrostatic pressures exerted by the material being cast.

One of the major problems which is thought to exist in this technique use for electromagnetically casting materials such as silicon, is the tendency for surface tension forces to minimize the large surface area to volume ratio of the liquid metal being formed and cast. The surface tension acts to begin shrinking the long transverse direction of the molten strip in the containment zone 56 to form a section which is elliptical or ovoid, then circular and possibly even nipping off the strip entirely. This is more fully described in the Yarwood et al. application mentioned above. The large molten material sump 18 creates a substantial pressure head which counteracts the tendency of the surface tension to neck down the strip. However, when the molten material enters the section of the electromagnetic field where it is formed into a desired thin strip shape, the electromagnetic force from the inductor 28 acts in conjunction with surface tension forces to cause the tendency of necking down. It should be noted that the present invention is primarily used in the formation of thin strip shaped material which may have a thickness of approximately 0.1" or less. The problem of surface tension is particularly pronounced in the formation of such thin strip material. In the production of somewhat thicker or larger sized ingots of material, the problem of surface tension is less pronounced and may be negligible because of the relatively stronger effects of pressure head and gravity and the reduced electromagnetic effect within the molten material from the inductor.

The purpose of the non-magnetic screen 34 is to fine tune and balance the magnetic pressure with the hydrostatic pressure of the molten material 12 near the upper surface 66 of the sump 18 of molten material. The non-magnetic screen may comprise a separate element as shown or may be integrated into other structural elements of the apparatus such as the inductor as in the patents to Goodrich et al.

Initially, a conventional ram 68 and bottom block 70 is held in the solidification zone 56 of the mold 24 to allow the molten material to be poured into the mold at the start of a casting run. The ram and bottom block are then uniformly withdrawn at a desired casting rate by means of a withdrawal mechanism 72 which may be of conventional design.

Solidification of the molten material which is magnetically contained in the mold 24 is achieved by direct application of a coolant medium such as inert gas or liquid from the cooling manifold 30 to the surface of the solidifying casting 32. In the prior art, as shown in FIG. 1, water is applied to the casting surface just below the inductor and in very close proximity therewith. It is also feasible to apply the coolant to the solidified surface of the casting within the inductor by providing slots or ports in the inductor itself.

The prior art embodiment of FIG. 1 divides the overall electromagnetic containment zone into two zones 64 and 56. Each zone 64 and 56 has a corresponding surface 58 and 60, respectively, facing the molten material. The surface 60 has a general shape corresponding to the desired shape of the thin strip casting 32. The surface 58 is flared outwardly from the surface 60 to provide at the top 74 of the inductor 27 an air space defining a casting zone having a first cross-sectional area which is substantially greater than a second cross-sectional area of the air space defining a casting zone of the inductor 28. Preferably, the first cross-sectional area is greater than about five times as large as the second cross-sectional area and most preferably at least seven times greater.

The current in the inductor 27 has a tendency to concentrate near the inductor 28 because it represents the shortest path. However, at a suitable power level, sufficient current should flow in the inductor 27 to support the molten sump 18. This is a highly desired characteristic of the illustrated inductor 27 because the hydrostatic forces provided by the molten material are highest near inductor 28 since the molten metal head height at that level is the greatest. Therefore, it is desired that the current density or current per unit area of surface 58 at that level also be the greatest. As one proceeds toward surface 74, along the flared portion 58 of the inductor 27, the current density gradually decreases as the current path increases. This is desirable because the molten metal head height which is supported at each succeeding point outwardly along the flared surface 58 decreases correspondingly. The angle of inclination of the surface 58 is preferably selected so that there is a general balance between the current magnitude in the inductor and the hydrostatic pressure exerted by the molten material at each point in the containment zone 64.

The provision of a large sump in the prior art apparatus has a number of advantages. The sump contains a sufficiently large volume of molten material to insure the melting of additional material being fed into the sump without the creation of any significant temperature differentials. Also, the ability to control the temperature more precisely prevents premature solidification of the molten material in the apparatus. The large volume of molten material in the sump creates a larger hydrostatic pressure head which tends to reduce the problems with the surface tension as mentioned above. The height of the sump can be more easily controlled due to its larger volume whereby the hydrostatic pressure can be maintained substantially constant. Further, the flow of molten material from the sump can be precisely controlled which allows the hydrodynamic force to be held constant. This ability to reduce fluctuations in the hydrostatic pressure provides a resultant strip product of higher cross-sectional and thickness uniformity.

FIG. 1 employs a non-magnetic screen 34 or shield to intercept a portion of the field from the inductor 27 near the top surface 74 to prevent undue rounding off of the top corners of the molten sump 18. In practice, however, the inductor 27 may be shaped, as described in U.S. patent application Ser. No. 213,125, filed Dec. 4, 1980, by J. Yarwood et al., to eliminate the need for the shield 34 which, therefore, is not believed to be an essential element in this apparatus. This is the case since the current density at the top 74 of the inductor 27 is at its lowest value due to the large current path.

The process and apparatus described by reference to FIG. 1 is particularly adapted for the casting of thin strips from materials such as semi-conductors, metals, and alloys. In such an instance, the cooling medium provided by the coolant manifold 30 is water, gas or other suitable medium as desired. In addition, the entire apparatus and process may be done within any desired controlled atmosphere by producing a control chamber 75.

The present invention is particularly concerned with problems which might arise in the casting of semi-conductive materials such as silicon in the shape of ribbon having very thin cross sections. This is especially true of silicon for photovoltaic applications where thicknesses of as little as 0.004 to 0.010″ are contemplated. In order to achieve containment conditions for shaping such thin ribbon, it is thought that very high AC frequencies will be required in the shaping inductor, i.e. the lower conductor 28 shown in FIG. 1 described above. Thus, if the frequency is selected to allow the ribbon thickness to be approximately 2δ, as described in the application to Yarwood et al., then the frequency range required for 0.010 to 0.004″ ribbon would be approximately 10 to 80 megahertz. Use of such high frequency and, hence, thin conductive paths results in extremely high power consumptions when utilizing inductors of the type shown in the prior apparatus of FIG. 1.

A further disadvantage of the inductor shaping system illustrated in FIG. 1 is the comparatively long length over which the thin ribbon is shaped. Such an arrangement is thought to aggravate the high power losses of this technique by applying the required very high frequency containment current density over this comparatively long length. In fact, for a given frequency the power utilized under these circumstances is roughly proportional to the length over which the current is induced. This is because the induced current per unit height J required for the containment of a head h is proportional to $h^{\frac{1}{2}}$:

$$J \propto h^{\frac{1}{2}}$$

Thus, the total current I induced over a ribbon length L is proportional to L:

$$I \propto h^{\frac{1}{2}} L$$

The resistance (R) of the silicon is inversely proportional to L:

$$R \propto L^{-1}$$

Power consumption is given by $I^2 R$ so that:

$$\text{power is } \propto (h^{\frac{1}{2}} L)^2 L^{-1} \text{ or } hL$$

That is, as stated above, the power absorbed is proportional to the length over which current is induced. Accordingly, from the point of view of power consumption, the high frequency shaping inductor (inductor 28 of FIG. 1) should concentrate its field over a short length of the casting as possible consistent with shape control. The present invention provides for decreased high frequency power consumption and thus increased operating efficiency as well as substantial elimination of surface tension or other shape control problems as described above.

Figure 2:
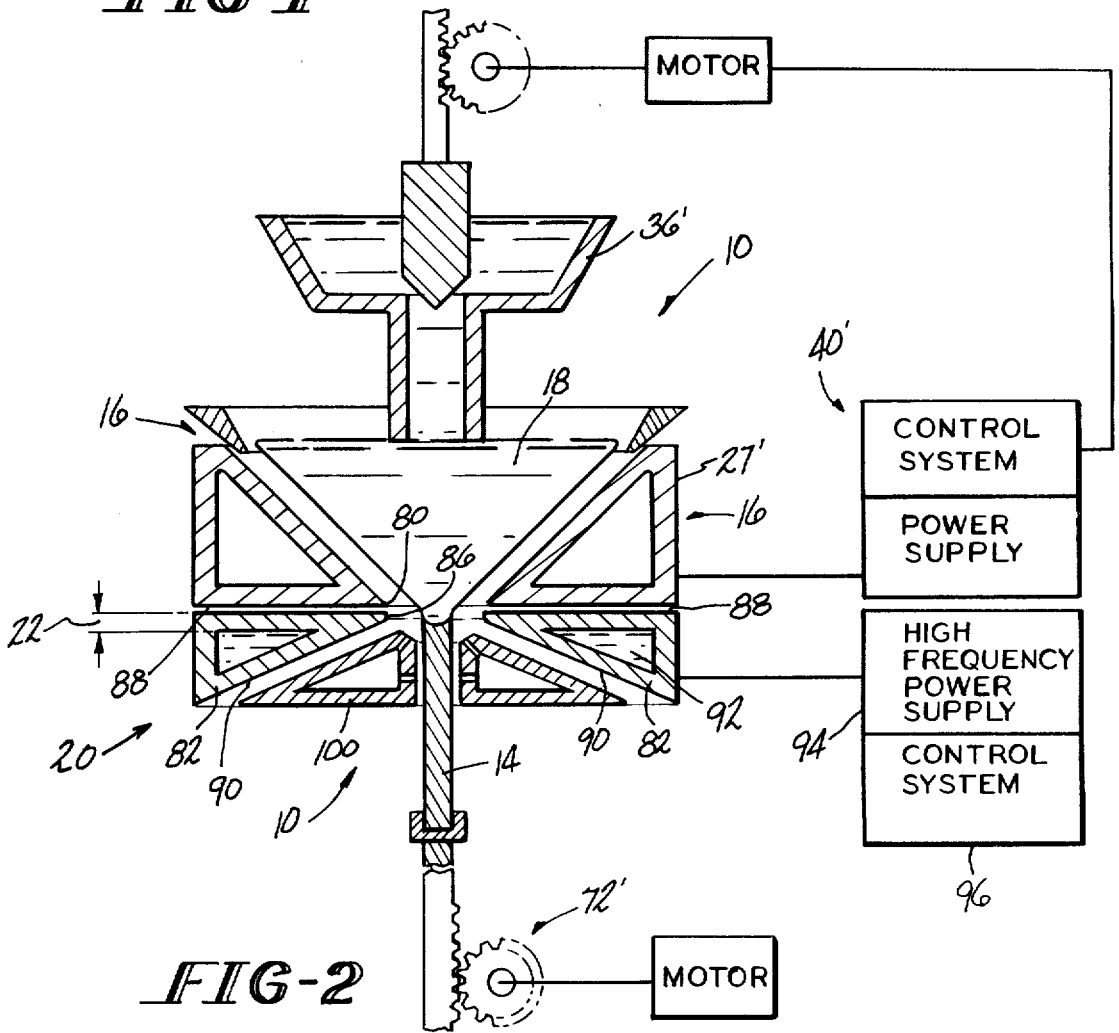
FIG. 2 is a schematic representation of a casting apparatus in accordance with one embodiment of the present invention.

Referring to FIG. 2, there is shown an apparatus 10 for electromagnetically forming a material 12 into a desired thin strip shape 14. The apparatus is similar to the prior art apparatus as shown in FIG. 1 and may operate in substantially the same manner with the exception of the forming and solidification aspects within the second portion 20. Portions of the apparatus of FIG. 2 which are substantially the same as shown in FIG. 1 are indicated by the same numeral primed.

The first portion 16 of the apparatus 10 may include an inductor 27′ receiving material 12 from a trough 36′ and controlled by a head control system 40′. Although a particular configuration of the inductor 27′ is illustrated as well as a feed control system 40′ as in the prior art, it is within the scope of the present invention to shape the inductor 27′ to alter the shape of the sump 18 as well as replenishing the sump 18 by other means such as feeding a strip of silicon into the molten sump. The smallest cross section 80 of the inductor 27′ carries the highest current density of the inductor and shapes the molten material 12 to correspond with the shape of the cross section 80 directly adjacent to its entrance into the containment zone 22. In the transition zone between the cross section 80 and the containment zone 22, there is an overlapping of the electromagnetic fields of the upper inductor 27′ and the lower inductor 82 to support the melt.

The second portion 20, downstream of and communicating with the first portion 16, defines a containment zone 22 for electromagnetically shaping the molten material into the resulting thin strip shape 14. The second portion includes an inductor 82 to concentrate current and produce an electromagnetic field to establish the containment zone. The inductor 82 may be considered a concentrator within the terms of this specification and as illustrated in FIG. 2, including a single turn inductor 82 for concentrating current to apply a magnetic field to the molten material within the zone 22.

The inductor has an inner surface 86, immediately adjacent and surrounding the molten material, from which the primary electromagnetic field emanates to form substantially straight vertical surfaces in the molten material. This inner surface 86 may be substantially parallel to the direction of casting of the strip 14. However, it is within the scope of the present invention to form the inner surface with any shape such as a convex curved surface facing the molten material. In fact, the surface may be a knife edge formed by the intersection of top surface 88 and the flared downward and outward surface 90 of the inductor 82. As the surface 86 which faces the molten material becomes narrower and narrower, the current density increases since all of the current tends to move towards the shortest path. Although the concentration of the current has the advantage of being able to shape the molten material in the shortest containment zone and thus minimize the power requirements, there is a limitation in that too much current density can cause surface 86 to heat up to such an extent that it burns off or causes other problems such as arcing. The length of the containment zone 22 or the surface 86 may be between approximately 0.5 mm and 5 mm and preferably between 1 and 3 mm. In addition, the perimeter of the surface 86 may be generally rectangular in shape to correspond to the thin strip shape being formed. It is also within the scope of the invention to form the perimeter in accordance with the principles as described in U.S. patent application Ser. No. 213,125, filed Dec. 4, 1980, by Yarwood et al., mentioned herein.

The inductor as shown in FIG. 2 is generally triangular in shape with an outward surface 90 flared downward in the direction of casting. Although the exact shape of the inductor 82 is not crucial to the present invention, it is necessary to create it with a thickness that can allow for the provision of a cooling medium as described hereinbelow. Accordingly, the surface 90 is preferably at an angle of greater than 45° from the thin strip 14 and preferably greater than 60°. Although an electromagnetic field is generated from the surface 90, it does not have a substantial effect on the formation of the thin strip. However, if the surface 90 were too close to the strip 14, it may radiate heat towards the strip and create difficulties in solidifying the strip.

The inductor includes a hollow passage 92 to carry a cooling medium such as water. The passage 92 may be of any desired shape to provide the desired cooling effect. The cooling medium acts to lower the temperature of the inductor so that it will not heat up to a very high temperature and radiate the heat to the strip being formed. In the event that the material within the containment zone or adjacent thereto is heated to a very high temperature, it may be difficult or impossible to solidify the strip within the containment zone 22 in order for the process to properly work.

A high frequency power supply 94 applies an alternating current to the inductor to generate the magnetic field which forms the containment zone for the molten material. It is generally contemplated that the power supply 94 operates from between 4 and 80 megahertz and will be between 1 to 3 orders of magnitude higher in frequency than the power supply associated with the head control 40'. For example, the power supply 94 would operate at approximately 4 megahertz or above, while the power supply associated with system 40' would operate at 0.4 megahertz or below.

A control system 96 is associated with the high frequency power supply and acts to alter the inductance of inductor 82 to adjust the shape of the thin strip.

A cooling manifold 100 is located downstream and adjacent to the inductor 82. The manifold directs a stream of coolant such as an inert gas or liquid against the material to cause solidification of the thin strip within or directly adjacent the downstream side of the inductor 82. The details of this manifold 100, which is only exemplary of any suitable cooling device, are described hereinbelow with regards to FIG. 5. The primary function of the manifold is to cool the thin strip, preferably within the containment field, so that it can maintain the desired thin strip shape after the strip moves downstream and out of the field of the inductor 82.

In operation, the molten material 12 is fed through the trough 36' into the sump 18 which is supported by the electromagnetic field generated by the inductor 27'. As the molten material moves downward in the casting direction, it is pinched down until it reaches the smallest cross section 80 where it is from two to five times greater than the size of the final desired cross section of the thin strip 14. Since the inductor 27' interacts with a molten material of relatively larger cross section, it is able to operate at a lower frequency than the strip shaping inductor and, hence, the power consumption and other operating costs are reduced. The molten material then enters the containment zone 22 of the second portion 20 where it is pinched down by the electromagnetic field to its final cross section having the desired final shape by the inductor 82. This final shaping occurs within a relatively short containment zone of 5 mm or less whereby the high frequency power supply requirements are minimized to provide a power savings of approximately 50% more from the power required in the prior art system of the type illustrated in FIG. 1. In addition, capital and operating costs of the necessary power supply will be considerably reduced. While the molten material is still in the electromagnetic containment zone 22, a stream of coolant medium is directed against the material to solidify or freeze it so as to maintain the desired geometry or shape developed by the field generated by the inductor 82. The solid strip 14 is withdrawn from the containment zone at a desired rate which may be controlled by a withdrawal mechanism 72'.

Referring to FIG. 3, there is illustrated a second embodiment of the present invention. This embodiment is similar to the first embodiment of FIG. 2 with the exception of the second portion 20 where a concentrator 110 replaces the inductor 82 of the first embodiment. The concentrator includes a primary coil device 112 formed of a multi-turn coil 114 which may be formed of between approximately 1 to 25 turns. The primary coil device 112 is preferably located directly adjacent to and acts to induce current in the concentrator 110.

The concentrator 110 is fabricated from a sheet 117 of preferably non-magnetic material, such as copper, having an inner edge constituting a surface 118 located directly adjacent and downstream from the lower end of the inductor 27'. The inner surface may extend downward the thickness of the sheet which is preferably between 0.5 mm and 5 mm thick in order to create an electromagnetic containment zone 22 of the desired length as within the first embodiment. The inner surface 118 may be shaped to be a flat surface parallel to the thin strip or a convex surface facing the strip or even possibly a knife edge. The advantages and considerations in forming the inner surface 118 are described above with regard to the inner surface 86 of the first embodiment. In addition, the periphery of the inner surface may be formed in a somewhat rectangular shape in accordance with the teachings of the Yarwood application, Ser. No. 213,125, filed Dec. 4, 1980. The sheet 117 of non-magnetic metal may preferably have a slotted, disc-like shape which extends outward and downward from the inner surface at an angle of between 30° and 75° to the casting direction axis 120. However, the preferred range of the latter angle is between 45° and 60°. The explanation of the variations of the electromagnetic field created by the secondary coil device with changes in angle will be described hereinbelow. A slot 121, as best seen in FIG. 4, extends from the edge 122 to the inner surface 118. The outer edge 122 of the sheet 117 may be substantially ovoid as shown in FIG. 4 or any other desired shape such as for example circular or rectangular.

The multi-turn coil 114 is positioned in close proximity to the sheet 117 and extends outwardly from the inner surface 118 towards the outer edge 122. The innermost turn 124 may be situated as close to the inner surface 118 as is practically possible given the physical constraints of the apparatus 10. The multi-turn coil may be connected to a high frequency power supply 125 which is controlled by a control system 126. In addition, the multi-turn coils have a hollow center 128 through which a cooling medium, such as water, may be circulated. The first coil 124 may be joined to the sheet 117 by any means such as for example soldering. The solder joint may extend on both sides of the coil turn 124 for a fraction of one turn. By passing a cooling medium through the multi-turn coils, the coils and the sheet 117 are cooled down to the desired operating temperature. By connecting the coil 124 directly to the sheet, the sheet itself has enhanced cooling and, therefore, does not generate too much heat to detract from the formation and solidification of the thin strip material as described above with respect to the first embodiment. Of course, although only one coil is shown welded to the sheet, it is within the scope of the present invention to weld a plurality of coils to the sheet to enhance the cooling. However, there is a limitation in that the current gets short-circuited through the sheet, and the primary coil may not induce sufficient current in the secondary coil (sheet 117) as required.

The concentrator 110 serves two functions in that it both transforms the current from the multi-turn inductor into the secondary coil 116 and at the same time concentrates the current at the throat or inner surface 118 adjacent to the thin strip material. Accordingly, the physical arrangement of the concentrator must allow for both effective coupling of the electromagnetic field generated by the secondary coil with the molten material and concentration of the current at or near the surface 118. In order to achieve the most effective coupling of the field from the secondary coil device with the material 12, the primary coil should surround the concentrator and the concentrator should be tubular in form, as shown in Figure 3.29 on page 95 of the Davies and Simpson reference, so that its inner surface would be substantially parallel to the withdrawal axis 120 of the thin strip. On the other hand, effective concentration is achieved by a flat sheet extending at right angles to the withdrawal axis. The optimum arrangement is, therefore, a compromise between the two concepts, such as shown in FIG. 3, with the primary coil surrounding the concentrator while the latter is angled at approximately 60° from the withdrawal axis 120 to form a slotted funnel shape.

It is also within the scope of the present invention to position the primary coil on the opposite side or below the secondary coil (not shown). Although in such a configuration coupling efficiency is sacrificed, the secondary coil may be positioned closer to the bottom of the upper inductor especially where larger angles between the withdrawal axis and the secondary coil are desired.

As previously explained in regards to the concentration of current in the inductor 82 of the first embodiment, substantially all of the current in the secondary coil device 116 is concentrated at its inner surface 118. Thus, the electromagnetic field is concentrated over a very short region or containment zone between approximately 0.5 and 5 mm. This embodiment has an additional advantage over the single turn coil of the first embodiment in that the containment current in the secondary coil is stepped up by what is in effect an autotransformer at the most energetically advantageous stage. Thus, high current exits only in the sheet 117 of the concentrator 110. This arrangement, therefore, saves power by both concentrating the field and stepping up the current at the inductor.

As with the first embodiment, a cooling manifold 100' is provided for solidifying the molten material, preferably in the containment zone 22. By referring to the explanation of the construction and operation of the first embodiment, further details of the operation of the second embodiment may be ascertained.

A third embodiment of the present invention is related to the heat extraction from the material being electromagnetically cast.

Figure 5:
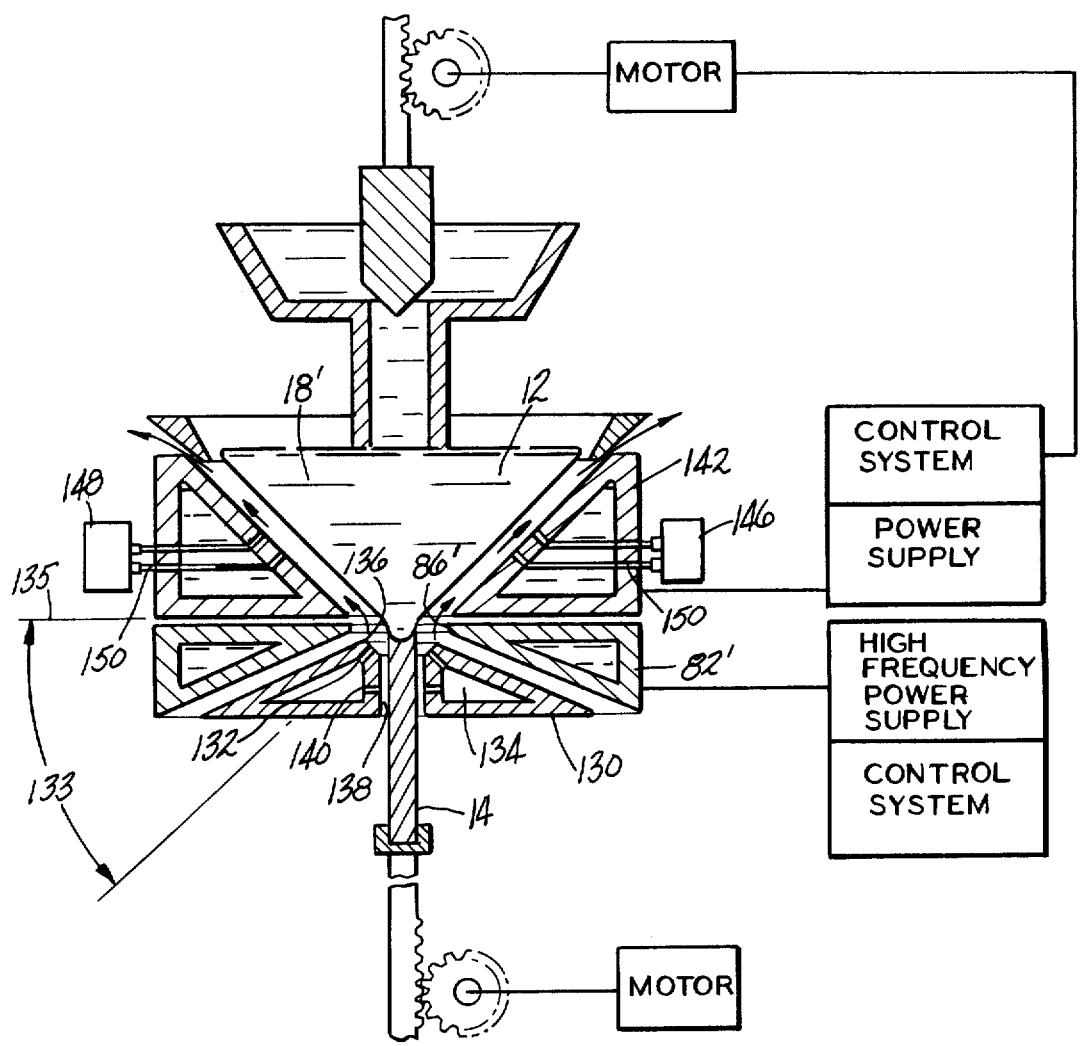
FIG. 5 is a schematic representation of a casting apparatus including auxiliary cooling in accordance with the present invention.

Referring to FIG. 5, there is shown a manifold 130 which is positioned downstream from the high frequency shaping inductor 82'. The manifold surrounds the solid ribbon 14 as it emerges from the lower inductor 82'. A discharge port 132 directs a sheet or jets of cooling medium from within a hollow portion 134 of the manifold primarily against the molten material 12 being cast. The angle 133 of the discharge port 132 to a horizontal axis 135 extending perpendicular to the vertical axis in the direction of casting is between 30° and 90°. The discharge port may be a slot or series of slots extending about the periphery of the top surface 136 of the manifold. Alternatively, the discharge port may be formed of a plurality of orifices or a combination of slots and orifices. The top surface of the manifold is preferably rectangular in shape to generally correspond to the shape of the thin strip being cast. Of course, it is within the scope of the present invention to shape the top surface 136 and the inner surface 138 in any desirable shape to correspond to the material being cast as well as taking into account the solidification requirements for the material. The orifices or slots comprising the port 132 may also have various cross sections so as to either create a narrow sheet or jets of cooling medium or a wider, more flared-out system of coolant.

The manifold also includes a secondary discharge port 140 which directs coolant against the solidified strip 14. As with the primary discharge port 132, the secondary discharge port 140 may be formed from either a slot, a series of slots, a plurality of orifices, or a combination of slots and orifices. The secondary discharge port may be provided to extract additional heat from the strip if required. Also, it may perform an important function in preventing reheating from the inductor 82'.

The manifold 130 is preferably constructed of a non-metallic insulating material such as for example plastic, glass, or ceramic. The material must be stable under the operating conditions and, hence, high temperature stability is an important requirement. Some of the contemplated materials include machinable ceramics such as for example silicon nitride and machinable glasses such as Corning Macor.

The manifold is preferably positioned downstream and directly adjacent to the lower inductor 82'. The manifold as shown is shaped to fit with the inductor or concentrator disclosed in either the prior art embodiment or in the embodiments disclosed herein. It is, however, within the scope of the present invention to form the manifold in any desired shape as long as the cooling function can be obtained. In the embodiments disclosed in FIGS. 2-4 of the present invention, it is very important that the concentrated field at the forming inductor or concentrator receives cooling within the containment zone in order that the strip immediately solidifies. The manifold, as shown in FIG. 5, suits this need precisely. It should be noted that the discharge port 132 may be directed so as to cause the coolant to impinge upon the material either within or immediately below the shaping zone as defined by the inductor 82'. This position depends on the material being cast, the rate of heat extraction from the strip, the speed of movement of the strip. The ideal location for the embodiments of FIGS. 2-4 is where the liquid to solid transition point of the material remains substantially fixed within the containment zone of the inductor.

The cooling medium delivered by the manifold is preferably inert to the material being cast. If the material being cast is a high purity silicon, the cooling medium should be inert to the silicon in the temperature range to which it is heated. Under these circumstances, the use of water is precluded. However, any inert or non-reactive gas or liquid may be used. Specifically contemplated are helium, argon, and nitrogen either in the gaseous or liquid phase.

In operation, the coolant system from the discharge port 132 is directed upward, as indicated by arrows, into the inductor's 82' throat and is vented at the top of the full containment inductor 142 after it has passed upward between the material 12 in the sump 18' and the inner wall of the inductor 142. The coolant preferably extracts as much specific heat as possible from the molten material in the sump so as to bring it down close to the solidification temperature. This avoids any superheating of the material in the sump due to the I²R heating from the inductor 142. By keeping the temperature of the sump close to the solidification temperature, the molten material can be more easily solidified in the shaping inductor 82'. After the molten material is finally shaped in the inductor 82', it must be almost immediately solidified. Manifold 130 directs the coolant against the surface of the strip in the containment zone of the shaping inductor to both achieve two functions. First, it extracts the specific heat to lower the temperature of the molten material to the solidification temperature. Then, it removes the latent heat so that the strip solidifies in the shape which is formed by the inductor 82'. It is within the scope of the present invention for the discharge port 132 to cause the jets or sheet of coolant medium to impinge both on the molten as well as the solid portions of the strip within the containment zone of the shaping inductor. As the strip continues to move downstream away from the throat of the shaping inductor, the secondary discharge port 140 may be provided to direct a sheet or jets of coolant medium against the solidified strip to prevent any reheating due to the radiation from the shaping inductor and to generally further cool the strip if desired.

Another embodiment of this invention (not shown) provides the discharge port through the inductor surface 86' and thereby either eliminates the cooling manifold 130 or provides additional cooling in conjunction with the manifold as required. Of course, this embodiment requires that the inner surface 86' of the shaping inductor be wide enough to accept a port without adversely effecting the shaping quality of the inductor. It is also within the scope of the present invention to provide a discharge port in the separation between the shaping 82' and the containment inductor 142.

An auxiliary cooling device 146 and 148 may be provided to cool the material within the containment pool 18' to prevent any superheating of the material 12 as previously mentioned. The coolant medium, which may be the same as used by the manifold 130, is preferably piped through the upper inductor in thin tubes 150 and discharged, through discharge ports, against the surface of the contained silicon pool as shown. The discharge ports may be of any desired shape or configuration and oriented upwardly, horizontally, or downwardly or any combination of these as desired. In addition, there may be any desired number of tubes 150. They may be connected to auxiliary cooling manifolds. When the auxiliary cooling manifolds are used in conjunction with the cooling manifold 130, it is important that the coolant being discharged from the auxiliary manifolds does not interfere with the flow of coolant from the primary coolant manifold 130.

While there has been described a sump supported by an electromagnetic field, it is within the scope of the present invention to support the sump with any means such as for example a crucible. In addition, while the invention has been described with a withdrawal mechanism acting in conjunction with a ram and bottom block, it is probably preferable to use a withdrawal arrangement where the cast strip is coiled as set forth in the Pryor application Ser. No. 139,617.

While the invention has been described generally by reference to semi-conductors and metals such as silicon or germanium, it may be adapted for use with other metals, alloys, and other metalloids as desired. In particular, it may be advantageously used with metals such as titanium, zirconium, vanadium, tantalum, and molybdenum.

The patents and references set forth in this application are intended to be incorporated by reference herein.

It is apparent that there has been provided in accordance with this invention an electromagnetic thin strip casting apparatus and process which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. In an apparatus for electromagnetically forming a material into a desired thin strip shape, said apparatus comprising:
   first portion means for containing a sump of said material in molten form,
   second portion means downstream of and communicating with said first portion means, said second portion means defining a containment zone of 5 mm or less for electromagnetically shaping said molten material into said thin strip shape whereby efficiency is improved by reducing power consumption.

2. The apparatus of claim 1 wherein said containment zone is between approximately 0.5 mm and 5 mm.

3. The apparatus of claim 1 further including means associated with said second portion means for solidifying said molten material into said desired thin strip shape.

4. The apparatus of claim 3 wherein said means for solidifying said molten material includes means for directing a coolant onto said material in said containment zone whereby said molten material is solidified into said desired thin strip shape within said containment zone.

5. The apparatus of claim 4 wherein said means for directing a coolant includes a manifold adjacent to said second portion means for directing said coolant between said molten material and said second portion means.

6. The apparatus of claim 5 wherein said coolant is an inert gas.

7. The apparatus of claim 5 wherein said coolant is an inert liquid.

8. The apparatus of claim 1 wherein said second portion means includes concentrator means producing an electromagnetic field to establish said containment zone.

9. The apparatus of claim 8 wherein said concentrator means has an inner surface immediately adjacent and surrounding said molten material to form substantially straight vertical surfaces in the molten material.

10. The apparatus of claim 9 wherein said inner surface is substantially parallel to the direction of casting.

11. The apparatus of claim 9 wherein said inner surface is substantially a convex surface facing the molten material being cast.

12. The apparatus of claim 9 wherein said concentrator means includes inductor means for applying a magnetic field to said molten material, and means for applying an alternating current to said inductor means to generate said magnetic field wherein said magnetic field forms said containment zone.

13. The apparatus of claim 9 wherein said inductor means has the inner surface directly adjacent and downstream from said first portion means and extending downward in the direction of casting for approximately 5 mm or less.

14. The apparatus of claim 13 wherein said inductor means includes a means for cooling said inductor means to enhance relative rapid solidification of said molten material into said thin strip shape.

15. The apparatus of claim 14 wherein said means for cooling includes a hollow passage in said inductor means for carrying a cooling medium.

16. The apparatus of claim 15 wherein said cooling medium is a liquid.

17. The apparatus of claim 9 wherein said concentrator means includes primary coil means and a secondary coil means,
   said primary coil is a multi-turn coil located adjacent to the secondary coil means for inducing current in the secondary coil means,
   and wherein said secondary coil means is a sheet of non-magnetic metal having said inner surface located directly adjacent and downstream from said first portion means and which extends downward.

18. The apparatus of claim 17 wherein said sheet of non-magnetic metal has a disc-like shape which extends outward from the inner surface at an angle of between 30° and 75° to the casting direction axis.

19. The apparatus of claim 18 wherein said angle is preferably between 45° and 60°.

20. The apparatus of claim 19 wherein said sheet has a thickness of approximately 5 mm or less.

21. The apparatus of claim 17 wherein said multi-turn coil is positioned downstream from the secondary coil means and is extended outward substantially parallel to the plane of the sheet of metal whereby the length of the containment zone can be minimized.

22. The apparatus of claim 17 wherein said multi-turn coil is positioned upstream from the secondary coil means and is extended outward substantially parallel to the plane of the sheet of metal whereby the current is efficiently concentrated at the inner surface of the secondary coil means.

23. The apparatus of claim 22 wherein said multi-turn coil includes means for cooling said secondary coil means to enhance relatively rapid solidification of said molten material into said thin strip shape.

24. The apparatus of claim 23 wherein said means for cooling includes joining a single turn of said multi-turn coil to said secondary coil means.

25. The apparatus of claim 24 wherein said single turn that is joined is the turn located closest to said inner surface.

26. The apparatus of claim 25 wherein said multi-turn coil is hollow for carrying a cooling medium.

27. The apparatus of claim 26 wherein said cooling medium is a liquid.

28. The apparatus of claim 1, 9 or 17 wherein said first portion means is a means for electromagnetically containing and forming said sump of molten material.

29. The apparatus of claim 28 wherein said electromagnetic means is an inductor.

30. A process for electromagnetically forming a material into a desired thin strip shape comprising the steps of:
   containing a sump of said material in molten form,
   receiving the molten material from said sump in a containment zone of 5 mm or less defined by an electromagnetic field,
   shaping said molten material into said thin strip shape by said electromagnetic field whereby efficiency is improved by reducing the power consumption.

31. The process of claim 30 wherein said containment zone is between approximately 0.5 mm and 5 mm.

32. The process of claim 30 wherein said material is a semi-conductor.

33. The process of claim 32 wherein said semi-conductor is a silicon.

34. The process of claim 30 including the step of solidifying the molten material into said desired thin strip shape within said electromagnetic field.

35. The process of claim 34 including the step of providing a concentrator to form said electromagnetic field which establishes the containment zone.

36. The process of claim 35 including the step of positioning the concentrator immediately adjacent and surrounding the molten material to form the molten material into a thin strip with substantially straight vertical surface.

37. The process of claim 36 including the step of cooling the concentrator to partially control the heat generated by the inductor.

38. The process of claim 34 including the step of solidifying the molten material by impinging a coolant upon the material.

39. The process of claim 38 wherein the coolant is an inert gas.

40. The process of claim 38 wherein the coolant is an inert liquid.

41. The process of claim 30 or 35 including the step of electromagnetically containing and forming the sump of molten material.

42. The process of claim 41 including the step of providing an inductor for electromagnetically containing and forming said sump.

* * * * *